United States Patent [19]

Cole

[11] Patent Number: 4,719,430

[45] Date of Patent: Jan. 12, 1988

[54] LOW VOLTAGE CLASS B AMPLIFIER WITH LOW VALUE DECOUPLING CAPACITORS

[75] Inventor: William A. Cole, Mossley, Canada

[73] Assignee: Linear Technology Inc., Burlington, Canada

[21] Appl. No.: 878,467

[22] Filed: Jun. 25, 1986

[51] Int. Cl.$^4$ .............................. H03F 3/26; H03F 3/45
[52] U.S. Cl. ..................................... 330/265; 330/255
[58] Field of Search ............... 330/255, 263, 265, 270, 330/307, 264

[56] References Cited

U.S. PATENT DOCUMENTS

4,476,442 10/1984 Iwamatsu ............................ 330/265

Primary Examiner—Eugene R. LaRoche
Assistant Examiner—Steven J. Mottola
Attorney, Agent, or Firm—Rogers, Bereskin & Parr

[57] ABSTRACT

A class B push-pull integrated circuit suitable for low voltage operation, having two symmetrical halves. Each half circuit has first and second opposite conductivity type transistors having their collectors connected together to the base of a class B driver transistor, the collector of which drives the base of an output transistor. An AC input signal is divided into in-phase and anti-phase components one of which is applied to the base of each first transistor. An AC feedback loop extends from the collector of the fourth transistor through a voltage divider and level shifter to the base of the second transistor. A DC feedback loop extends from the base of the fourth transistor through a fifth transistor to the base of the second transistor. Decoupling capacitors extend from the bases of the fifth transistors and through a diode to ground. The arrangement allows use of small decoupling capacitors, and a current forced through the diode eliminates turn-on delay.

13 Claims, 6 Drawing Figures

LOW VOLTAGE CLASS B AMPLIFIER WITH LOW VALUE DECOUPLING CAPACITORS

FIELD OF THE INVENTION

This invention relates to a class B push-pull amplifier suitable for integration as an integrated circuit and operable in low voltage applications such as hearing aids.

BACKGROUND OF THE INVENTION

Previous class B push-pull amplifiers when made in integrated circuit form normally have required three relatively large value external capacitors for compensation and for signal decoupling purposes. When the amplifier is turned on, two of these capacitors must charge, producing turn-on delays of several seconds, during which time the current drain on the battery can be more than 100 times the quiescent current and no amplification occurs. This can be highly annoying to the user. In addition the high current drain may cause the power supply to current limit so that the circuit may never start. Further, typical prior art circuits also require significant idle current, and when the only power available is a tiny battery, this can considerably reduce the life of the battery.

BRIEF SUMMARY OF THE INVENTION

It is therefore an object of the present invention to provide a class B push-pull amplifier circuit, suitable for fabrication as a monolithic integrated circuit, in which the size of the external decoupling capacitors is reduced, thereby reducing the turn-on delay. In addition in a preferred embodiment of the invention the quiescent current drain is reduced, and the external compensation capacitor previously required is eliminated.

Accordingly, in one of its aspects the invention provides a class B push-pull integrated circuit amplifier suitable for operation with a low voltage power supply and for amplifying an input signal comprising a first AC input signal and a second AC input signal identical to said first signal but 180 degress out of phase with respect thereto, said amplifier comprising:
  (a) two half circuits, each half circuit being the same as the other and each comprising:
    (i) first and second opposite type transistors each having an emitter, a base and a collector and having their collectors connected together at a summing node,
    (ii) a third transistor connected to said summing node for amplification of a signal received by said third transistor from said summing node.
    (iii) a fourth transistor connected to said third transistor for amplifying a signal received from said third transistor and having an output for producing an output signal,
    (iv) a DC feedback loop for controlling the idle current of said fourth transistor, said DC feedback loop comprising a fifth transistor connected to said fourth transistor, and means connecting said fifth transistor to the base of said second transistor,
    (v) an AC feedback loop for controlling the AC gain from said first transistor to said fourth transistor and comprising voltage level shifting means connected between said output of said fourth transistor and said base of said second transistor,
    (vi) and a decoupling capacitor connected to said fifth transistor,
  (b) the emitters of said first transistors and said decoupling capacitors being adapted to be connected to one pole of said power supply,
  (c) the emitters of said second transistors being adapted to be connected to the other pole of said power supply,
  (d) the base of said first transistor of one said half circuit being adapted to receive said first AC input signal and the base of said first transistor of the other said amplifier half being adapted to receive said second AC input signal,
  (e) said outputs of said fourth transistors being adapted to be connected to a load.

BRIEF DESCRIPTION OF THE DRAWINGS

Further objects and advantages of the invention will appear from the following description, taken together with the accompanying drawings in which.

DETAILED DESCRIPTION OF PREFERRED EMBODIMENTS

Figure 1:
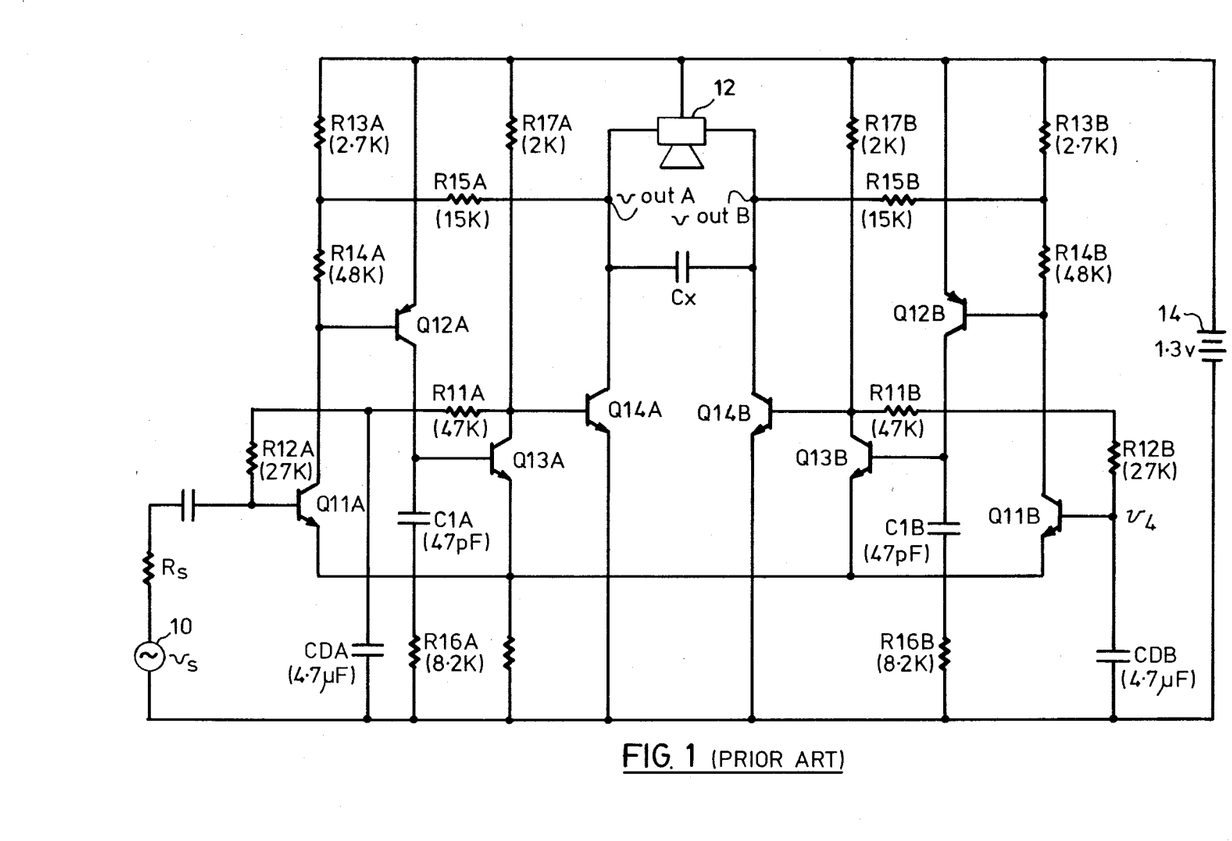
FIG. 1 is a schematic diagram of a prior art class B push-pull amplifier circuit.

Reference is first made to FIG. 1 which shows a typical prior art class B integrated circuit push-pull amplifier of the kind presently manufactured and sold by the applicant. Since the FIG. 1 circuit is conventional, it will be described only briefly. As shown, the circuit is largely symmetrical and corresponding transistors on the left and right hand sides of the circuit are indicated by the suffixes "A" and "B" respectively. Since the two sides of the circuit are essentially identical, the left hand side of the circuit will be described together with those portions of the right hand side which differ from the left hand side. Lower case letters will be used to indicate AC signals and upper case letters will be used for DC signals.

As shown in FIG. 1, the AC signal $v_s$ to be amplified is supplied from a generator 10 having an internal resistance $R_s$. The signal $v_s$ is applied to the base of transistor Q11A. The amplified signal at the collector of transistor Q11A is amplified by transistor Q12A and by driver transistor Q13A and is applied to the base of output transistor Q14A.

The DC idle current of transistor Q14A must be controlled at a level which is high enough to prevent crossover distoration but low enough to limit battery drain. This control is effected by a DC feedback loop consisting of resistors R11A and R12A, which set the DC level at the base of transistor Q14A. Transistor Q14A operates class B, with its collector current varying from zero to several milliameres during each half cycle. The two output transistors Q14A, Q14B drive an external load 12 which is typically a miniature loudspeaker. Power is supplied from a miniature battery 14.

AC feedback, to control the AC gain of the circuit, is provided by an AC feedback loop through resistors R15A, R14A to the base of transistor Q12A. The values shown in parentheses for the components are typical values.

In order for the collector current of output transistor Q14A to be a linear representation of the AC input signal, the base voltage of transistor Q14A must be a logarithmic function of the input signal $v_s$ (as is well known). If the AC signal at the base of the transistor Q14A is allowed to feed back to the base of transistor Q11A via the DC feedback loop consisting of resistors R11A and R12A, distoration will result. To prevent this, capacitor CDA shunts the AC signal to ground at the junction of resistors R11A and R12A. The signal is further decoupled by resistor R12A in conjuction with the impedance of generator 10.

On the right hand side of the circuit, decoupling is provided by capacitor CDB in conjunction with resistors R11B and R12B. The decoupling is thus asymmetric (since the input signal is not applied to the right hand side of the circuit). An AC voltage $v_4$ appears at the base of transistor Q11B, supplied by feedback from the base of transistor Q14B via resistors R11B and R12B. Voltage $v_4$ should ideally be zero but in practice is finite.

Assuming a low impedance signal source 10 and a gain of 100 for the circuit, the AC output signal across the output transducer 12 is given by $$vout = voutA - voutB = 100\ v_s - 100\ v_4 = 100\ (v_s - v_4).$$

As was the case for transistor Q14A, the signal at the base of transistor Q14B is highly distorted, having nearly 100 percent total harmonic distortion. The decoupling capacitor CDB must reduce these distortion components so that $v_4$ will be very small compared with $v_s$. For vout=1 volt, $v_s$=10 mv. Thus for less than 1 percent distortion, the harmonic components of $v_4$ must be below 100 microvolts. For a 400 Hz signal this requires that the decoupling capacitors CDA, CDB be large, typically 4.7 uF. Such capacitors are physically bulky, which is undesirable in a miniature circuit that should be as small as possible.

In addition, when power is applied to the circuit, the initial voltage across the decoupling capacitors CDA and CDB will be zero, causing transistors Q11A and Q11B to be turned off and Q14A and Q14B to be turned on with current limited only by resistors R17A and R17B and the betas of transistors Q14A, Q14B. The resultant current through transistors Q14A and Q14B may be as high as 50 ma, which may cause the power supply to current limit, with the result that the circuit may fail to start. Assuming that this is not the case, the voltage across capacitors CDA and CDB must charge to approximately 0.7 volts via resistors R11A, R12A and via resistors R11B, R12B. However the voltage at the base of transistors Q14A, Q14B is constrained to about 0.75 volts by the circuit as shown. Hence the available charging current is limited and it takes two to three seconds for the voltage at the base of transistor Q11A to reach 0.7 volts to turn transistor Q14A off. This delay, during which no amplification occurs, is often annoying for the user.

The FIG. 1 circuit also requires significant idle current in driver transistors Q13A and Q13B if low impedance loads are to be driven. For example, if a peak output current of 25 ma is required, the idle current in dirver transistor Q13A will have to be 300 microamperes to handle a worst case beta of 100 for transistor Q14A, even though the idle current in transistor Q14A may be only 150 microamperes. Thus the high efficiency of the class B output stage (transistor Q14A) is offset by the low efficiency of the class A driver stage (transistor Q13A).

Where the output transducer 12 of the FIG. 1 circuit is a miniature audio transducer (as will normally be the case for a hearing aid), such transducer usually includes a fine wire wound coil which exhibits both inductive and capactive characteristics over a broad range of frequencies. Such characteristics, in conjunction with parasitic capacitances in integrated circuit transistors, can produce sufficient gain boost and phase shifts around the AC signal loop consisting of transducers Q12A, Q13A, Q14A and resistors R15A, R13A and R14A to cause instability. To prevent this an external compensation capacitor CX is usually connected across the output transducer. Capacitor CX adds additional bulk and cost to the circuit.

Figure 2:
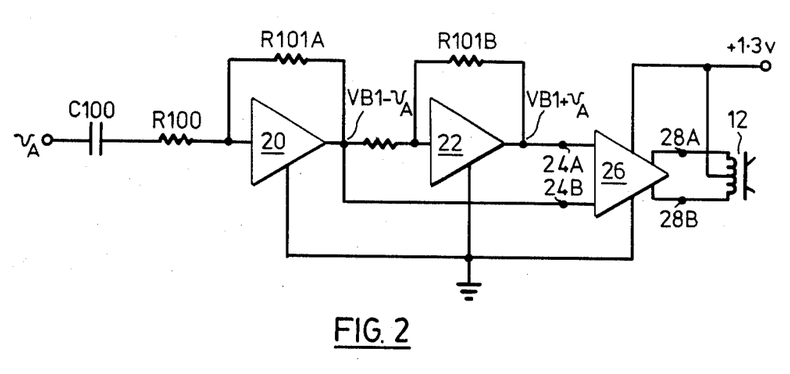
FIG. 2 is a block diagram of a circuit according to the invention.

Reference is next made to FIG. 2, which shows a block diagram of a circuit according to the invention. In the FIG. 2 circuit the AC signal vA to be amplified passes through capacitor C100 and resistor R100 to an amplifier 20. The output signal of amplifier 20 is shown as being VB1−vA, where VB1 is a preset DC bias voltage. This output signal is then applied to a second amplifier 22 which produces an output VB1+vA. The two output signals VB1+vA and VB1−vA are applied to two input terminals 24A, 24B respectively of a class B amplifier 26. The two output terminals 28A, 28B of amplifier 26 are connected to an output transducer 12, such as the loudspeaker of a hearing aid.

Figure 3:
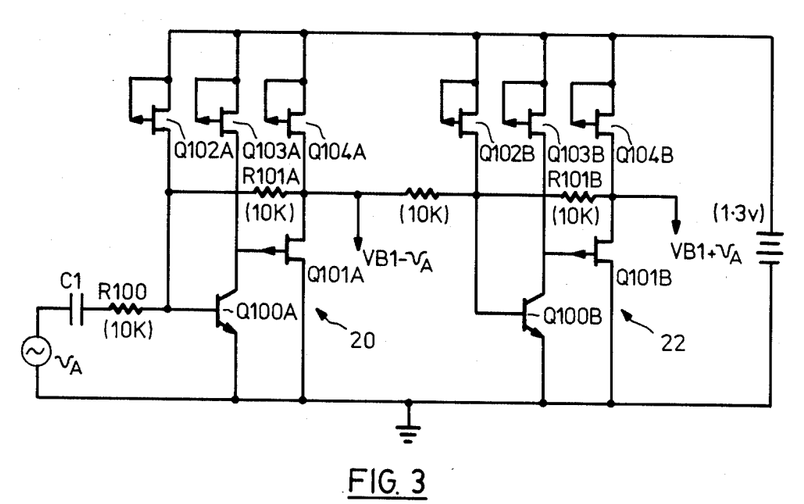
FIG. 3 is a schematic diagram of a circuit for generating certain signals used in the class B amplifier of the invenion.

Reference is next made to FIG. 3, which shows amplifiers 20, 22 in more detail. As shown, amplifier 20 includes a common emitter amplifier Q100A which provides ample gain (typically 50 DB) and phase inversion. Field effect transistor Q101A acts as a source follower and constitutes a unity gain buffer, so that transistors Q100A, Q101A effectively act as an inverting operational amplifier with a gain of 50 DB. This gain is reduced to unity (or any other selected gain) by feedback resistor R101A. Transistor Q102A acts as a current source which provides some of the base current for transistor Q100A. Transistor Q103A acts as a current source feeding current into the collector of transistor Q100A. The bias voltage level VB1 is set at the base of transistor Q100A by setting the current from transistor Q103A at a preset value. A further current source transistor Q104A provides current for the buffer stage Q101A.

The second amplifier 22 is identical with the first amplifier 20 and the transistors therein are indicated by "B" suffixes. Since the AC component of the input signal to amplifier 22 is inverted, the output of amplifier 22 is VB1+vA. The result is that the FIG. 3 circuit accepts the input AC signal vA to be amplified, and splits it into two components, each consisting of the same bias voltage VB1 together with out of phase AC components vA and −vA. These components could also have been generated by a center tapped transformer having its center tap supplied with bias voltage VB1.

Figure 4:
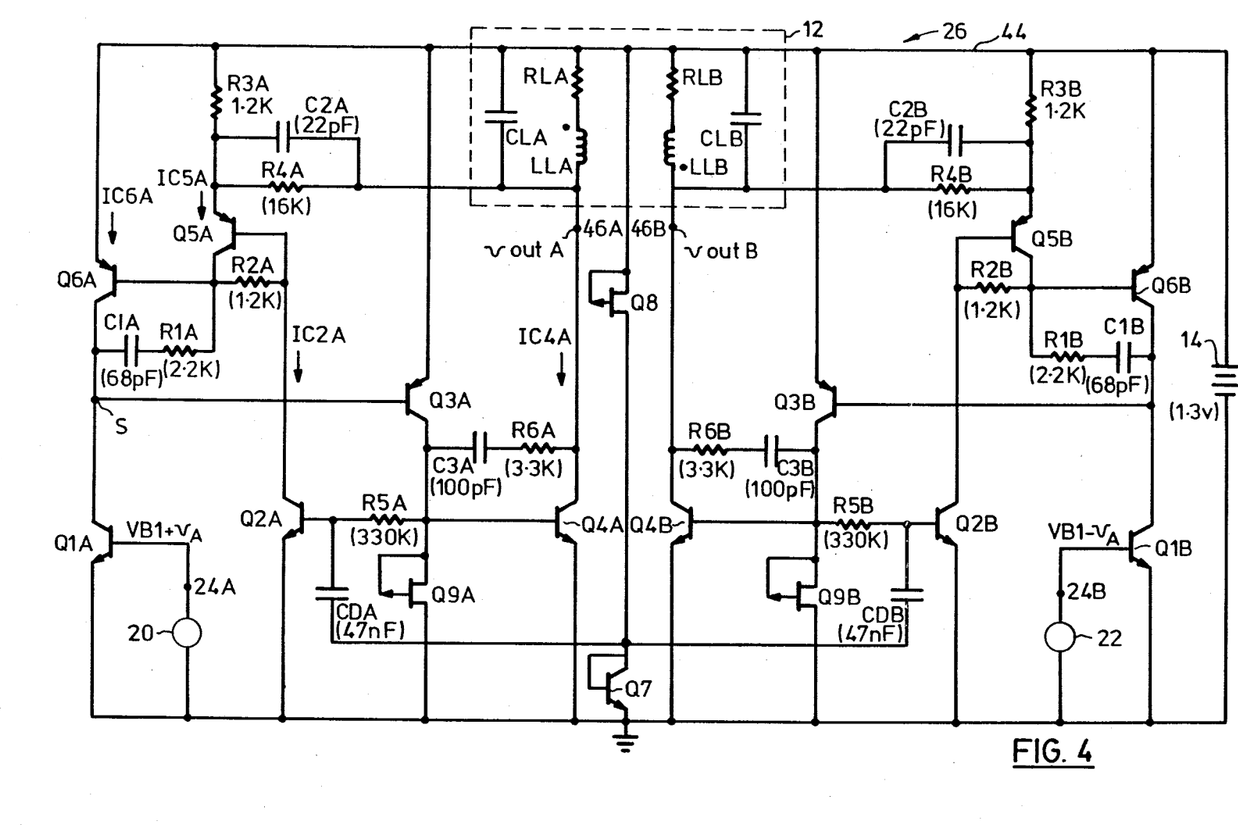
FIG. 4 is a schematic diagram of a class B push-pull amplifier according to the invention.

Reference is next made to FIG. 4, which shows amplifier 26. Amplifier 26 is a class B push-pull amplifier according to the invention. In the FIG. 4 circuit the left and right hand sides are again identical except as will be explained and are therefore indicated by the suffixes "A" and "B" respectively. Since the operation of both sides is largely the same, only the operation of the left hand side will be explained, together with the operation of that portion of the right hand side which differs from the left hand side.

In the left hand side of amplifier 26, input signal vA+VB1 is fed to the base of transistor Q1A. Transistor Q1A is the first of three stages of gain, the other two stages being driver transistor Q3A and output transistor Q4A. There is a DC feedback loop to control the idle current of transistor Q4A, such loop extending through transistor Q2A to the base of transistor Q6A. Transistor Q2A is a common emitter stage with diode connected transistor Q5A as its load and hence has a gain of −1. (It is assumed that transistors Q2A, Q5A are essentially identical except that they are of opposite conductivity types). The collector of transistor Q6A is connected to that of transistor Q1A at a summing node S. As before, the DC feedback loop ensures that the idle current of transistor Q4A is high enough to reduce crossover distortion and low enough to reduce battery drain. In operation, if the voltage at the base of transistor Q4A is high, then transistor Q2A turns on, turning transistor Q6A on. This causes the voltage at the base of transistor Q3A to rise, turning transistor Q3A off. This lowers the voltage at the base of transistor Q4A. The idle current of transistor Q4A is typically held at 120 microamperes in this manner.

In order to prevent current offsets caused by current being drawn by transistor Q2A through resistor R5A, it is preferred to provide base current compensation for transistor Q2A by a conventional current source (not shown) which supplies the normal base current requirement of transistor Q2A.

There is also an AC feedback loop from the collector of transistor Q4A. The AC feedback loop extends through a voltage divider consisting of resistors R4A, R3A. The AC voltage is then level shifted (i.e. its DC level is shifted) in diode connected transistor Q5A and is also applied to the base of transistor Q6A. With regard to the AC signal the circuit acts like an operational amplifier. If transistors Q1A and Q6A are made to have identical transconductance functions, then identical out of phase signals applied to their bases will result in exact cancellation at junction S of the signal currents from their collectors, and no signal current will flow to the base of transistor Q3A. Any difference between the signals at the bases of transistors Q1A, Q6A results in an error current flowing in the base lead of transistor Q3A, which current is then amplified by transistors Q3A, Q4A. The right hand side of the circuit is identical to the left hand side but is driven in anti-phase.

As in the prior art circuit, the signal at the base of output transistor Q4A is badly distorted and must be prevented from reaching the base of transistor Q6A via the DC feedback loop. This is accomplished by the filter formed by resistor R5A and decoupling capacitor CDA. Capacitor CDA is connected between the base of transistor Q2A and the base and collector of a diode connected transistor Q7. The emitter of transistor Q7 is connected to ground. A current is forced through transistor Q7 by a current source consisting of field effect transistor Q8. The current forced through diode connected transistor Q7 is such that the voltage across Q7 is equal to that of the base of transistor Q2A. Thus, during operation there is no DC voltage across decoupling capacitor CDA (or CDB), and hence on turning on the circuit, there is no long turn-on delay as in the prior art. The impedance is low enough that it may be considered a signal ground.

In the description which follows, the following terminology will be used. (As previously indicated, capital letters are used for DC currents and voltages and lower case letters are used for AC currents and voltages).

IC1A, IC2A, IC4A, IC5A and IC6A are the DC collector currents of transistors Q1A, Q2A, Q4A, Q5A and Q6A respectively.

VBE5A and VBE6A are the DC base to emitter voltages of transistors Q5A, Q6A respectively.

voutA is the AC output voltage from the collector of transistor Q4A to ground.

vb2A and vb6A are the AC voltages at the collectors of transistors Q2A, Q6A respectively.

The same terminology, with B suffixes, applies to the B side of the circuit.

In the FIG. 4 circuit, the DC collector current in transistor Q1A is determined by the bias voltage VB1 applied to its base. Neglecting base currents, the collector current in transistor Q6A must exactly equal that in transistor Q1A (since the collectors are connected together). Thus, neglecting base currents, the base-emitter voltage of transistor Q6A is given by $$VBE6A + IC2A \cdot R2A = VBE5A + IC2A \cdot R3A$$

Therefore $VBE6A = VBE5A + IC2A \, (R3A - R2A)$.

Since as shown R3A=R2A, and since Q6A and Q5A are matched transistors, therefore VBE6A=VBE5A and IC6A=IC5A However, neglecting base currents, IC6A=IC1A (as previously mentioned), and also IC5A=IC2A (since all of the collector current of transistor Q2A flows through transistor Q5A, which is acting simply as a level shifter), therefore IC2A=IC1A Further, neglecting base currents, $$IC4A = N \times IC2A$$

where N is the ratio of the area of the emitter of transistor Q4A to the area of the emitter of transistor Q2A.

Therefore $IC4A = N \times IC1A$, so that the quiescent or idle current of the output transistor Q4A is controlled by the bias voltage VB1. As mentioned, in the circuit shown bias voltage VB1 is set to control the idle current of transistor Q4 at about 120 microamperes.

(The resistance values shown in the FIG. 4 circuit are for an ideal circuit. In fact, to allow for base currents, resistor R2A is fabricated with a resistance of 1.1 Kohms; resistor R3A remains as shown with a resistance of 1.2 Kohms.)

Since the gain from the base of transistor Q2A to the base of transistor Q6A is unity, the AC signal at the base of transistor Q6A may be written approximately as:

$$vb6A = \frac{R3A}{R3A + R4A} \cdot voutA - vb2A$$

(A minus sign appears in front of signal vb2A because transistor Q2A provides phase inversion.)

Therefore $vb6A = 0.07 \, voutA - vb2A$ (assuming resistance values as shown).

Therefore $voutA = 14.3\ (vb6A + vb2A)$.

Since signal vb6A must be equal in amplitude and opposite in phase to the signal at the base of transistor Q1A, i.e. to signal vA (which is the input signal to be amplified), therefore $voutA = 14.3\ (-vA + vb2A)$.
By a similar analysis $$voutB = 14.3\ (vA + vb2B).$$

The resultant AC output signal $$\begin{aligned}vout &= voutA - voutB \\ &= 14.3\ (-vA - vA + vb2A - vb\ 2B) \\ &= -28.6\ vA + 14.3\ (vb\ 2A - vb\ 2B)\end{aligned}$$

It will be seen that in the AC output signal vout, the desired component is $-28.6\ vA$ and the distortion component is $14.3\ (vb2A - vb2B)$. Unlike the prior art, the distortion term depends on the difference in signals on the decoupling capacitors CDA and CDB rather than on the absolute level of the signal on one of them. A computer simulation of the circuit shown in FIG. 4 showed that for the values shown, the distortion in each of signals vb2A and vb2B was 63 percent but the distortion in their difference term was only 16 percent. Thus the decoupling network comprising capacitors CDA and CDB (and resistors R5A, R5B) need provide four times less attentuation than previously, which results in a fourfold reduction in the value of the decoupling capacitors.

In addition the distortion term is multiplied by 14.3 while the desired AC signal is multiplied by 28.6, unlike the piror art where they were both multiplied by 100. Four vout=1 volt, vA=35 mv. This means that for less than 1 percent distortion, the harmonic components of the distortion signal vb2A—vb2B must now be below 700 microvolts. This is seven times higher than in the prior art case, which means that the decoupling capacitors CDA and CDB can be seven times smaller than in the prior art. This, coupled with the fourfold reduction referred to above, results in a 28 times reduction in the value of the decoupling capacitors required. A further reduction in decoupling capacitors size by a factor of 4.5 is realized by increasing the value of the series resistors R5A, R5B from 74 Kohm to 330 Kohm. Thus the circuit shown in FIG. 4 allows a 100 fold reduction in the value of the external decoupling capacitors CDA and CDB. In a further embodiment, in order to improve circuit yield and control, resistors R5A, R5B had values of 200 Kohm each, so that for the same time constant capacitors CDA, CDB had values of 100 nF (which was still a 50 fold reduction in their value).

A further benefit of the circuit shown in FIG. 4 over that of FIG. 1 is a reduction in idle current drain. This is accomplished by fabricating the driver transistors Q3A, Q3B for the output stages as PNP transistors and operating them class B rather than using the NPN class A driver transistors used in the prior art. Transistors Q3A, Q3B idle at 6 microamperes each rather than at 300 microamperes each as in the FIG. 1 circuit. The collector current for transistor Q3A is provided and set by a current source consisting of field effect transistor Q9A. The combination of transistors Q3A and Q4A perform the same function as a Darlington connection but operate at low voltage.

A further advantage of the circuit in shown in FIG. 4 is the elimination of the external compensation capacitor CX for circuit stability. The output transducer or load 12 can be represented as a symmetrical circuit the left hand half of which has a series resistance and inductance RLA, LLA in parallel with a capacitance CLA (the right hand side is identical). The resonant nature of the load 12 and parasitic capacitances associated with the monolithic transistors, combine to cause potential circuit instability. In the prior art this problem was dealt with by a combination of one external and two internal capacitors (CX, C1A, C1B). The circuit shown in FIG. 4 uses three internal compensation networks on each side to render it stable without the need for external capacitance.

The resonant frequencies of typical miniature loudspeaker transducers 12 with which the FIG. 4 circuit is designed to operate are between 50 KHz and 600 KHz. Above the resonant frequency, transducer 12 appears as a capacitor so the output stage Q4A or Q4B acts as an integrator having a 90 degree phase shift and response falling at 20 DB per decade. Without compensation there is 40 Db of excess loop gain when the phase angle is zero degrees. The loop gain is the product of the gain from the base of transistor Q6A to the collector of transistor Q4A, and the attenuation from the collector of transistor Q4A to the base of transistor Q6A. The compensation networks must alter the gain and phase such that the loop gain is less in unity when the phase angle is 0 degrees. This will ensure stability.

The first compensation network consists of capacitor C3A and resistor R6A. Capacitor C3A has the effect of reducing the gain of the output stage Q4A near and above resonance, without altering phase. This is because the gain of ouput stage Q4A falls above resonance because of the capacitive load from the output transducer 12. Its gain falls at 6 db per octave. Part of the output signal of transistor Q4A is fed back to the base thereof through capacitor C3A and resistor R6A. The impedance at the collector of transistor Q3A serves as a load which affects the gain of transistor Q3A. If there is no capacitive load, the impedance would be expected to fall at 6 db per octave because the negative feedback causes a larger current to flow through the feedback loop as the frequency increases (due to the Miller effect where the gain of capacitor C3A appears to be multiplied by the gain of the stage). However the gain of transistor Q4A falls at 6 db per octave, so that capacitor C3A appears to fall in value at 6 db per octave, so the phase of the output stage Q4A is not reduced.

The gain of the output stage Q4A is reduced because at low frequencies, the impedance at the collector of transistor Q3A is reduced, and this reduces the gain at low frequencies and introduces a 90 degree phase shift. As the frequency increases, the capacitive load constituted by output transducer 12 loads transistor Q3A and reduces its gain. Calculations show that the gain is proportional to the raio of the value of CLA divided by C3A. In the result, capacitor C3A achieves a gain reduction of 15 db near and above resonance.

Resistor R6A introduces a positive phase shift above 100 KHz without a significant change in gain. This increases the frequency at which the phase angle reaches 0 degrees. Since the gain falls with frequency, this reduces the excess gain at 0 degrees of phase.

The second compensation network consists of capacitor C1A and resistor R1A. Here, capacitor C1A causes the gain to fall at 20 db per octave above 4 KHz, but also introduces a negative 90 degree phase shift. Resistor R1A introduces a positive phase shift above 200 KHz without a significant change in gain.

The third compensation network consists of capacitor C2A. This capacitor introduces a positive phase shift above 100 KHz without a significant change in gain.

Figure 5:
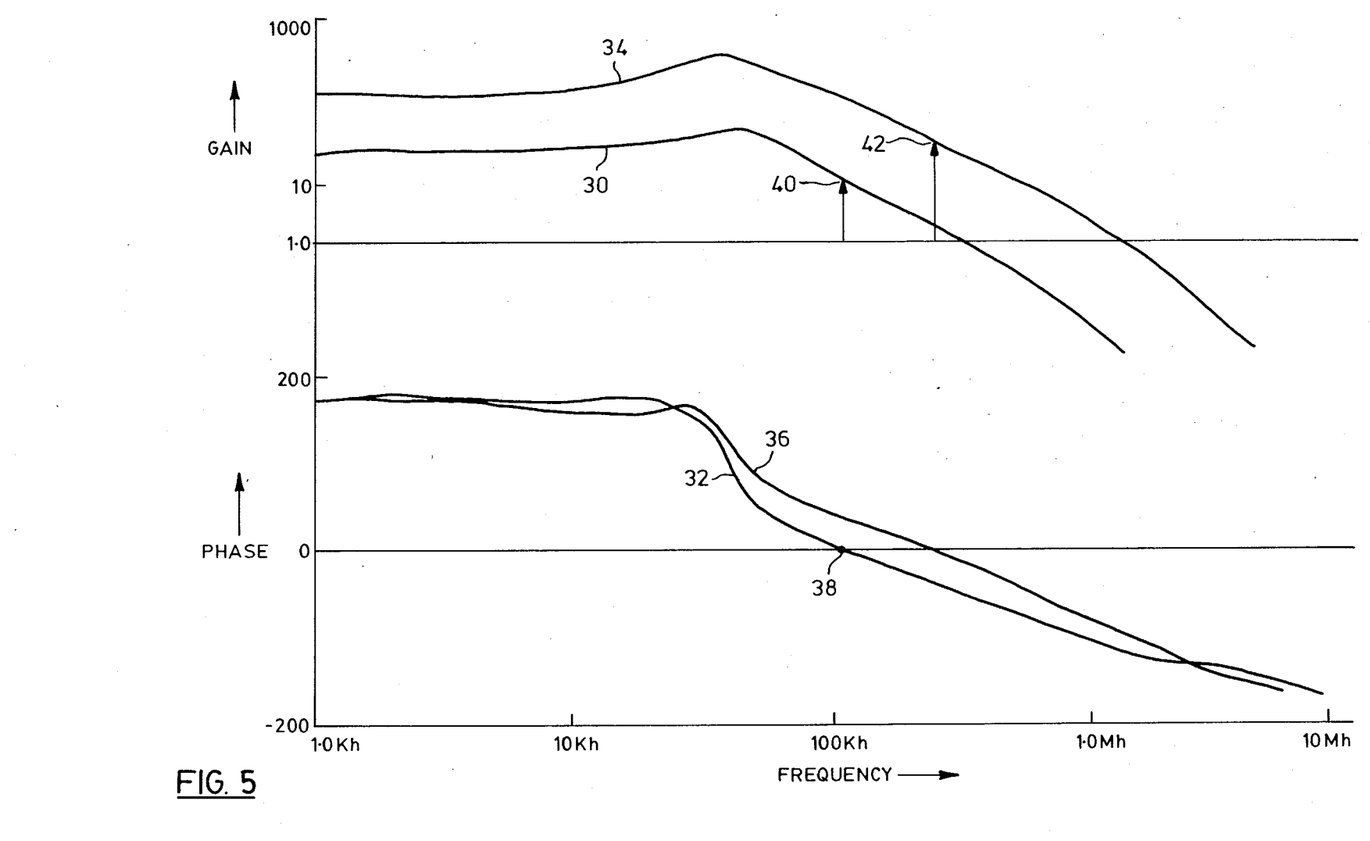
FIG. 5 is a graph showing gain and phase plotted against frequency for the FIG. 4 circuit without compensation.
Figure 6:
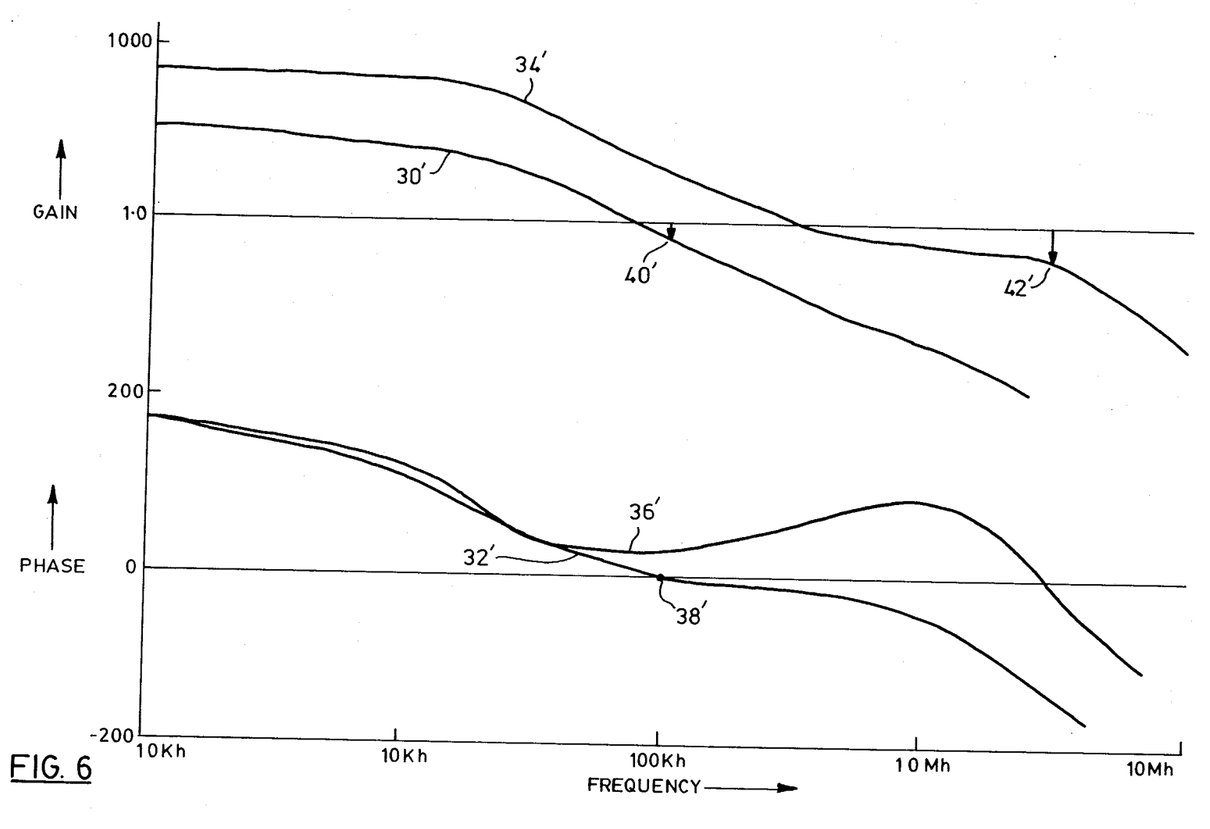
FIG. 6 is a graph showing gain and phase plotted against frequency for the FIG. 4 circuit.

The three compensation networks described, acting together, have the effect of reducing the loop gain to less than unity at the frequency at which the phase angle is zero. This is illustrated in FIGS. 5 and 6. FIGS. 5A, 5B show computer generated curves for loop gain and phase angle respectively for a 1,000 ohm output transducer 12 in the circuit of FIG. 4, without the compensation networks. Curves 30, 32 show loop gain and phase respectively for quiescent conditions and curves. 34, 36 show gain and phase respectively for large signal conditions (the output current of transistor Q4 is assumed to be 3 milliamps). It will be seen in FIGS. 5A, 5B that when the phase angle of curve 32 is zero (point 38), the gain at curve 34 (point 40) is well above unity. For large signal conditions the excess gain at point 42 in curve 34 is even larger. Thus the circuit is unstable.

FIGS. 6A, 6B show curves similar to those of FIG. 5A, 5B (primed reference numerals indicated corresponding numerals) but with the three described compensation networks in place. Here it will be seen that when the phase angles are zero for the quiescent curve 32' and the large signal cruve 36', the loop gain at curves 30', 34' is less than unity in both cases. Thus, the circuit is stable. It has been verified experimentally and by computer simulations that the three compensation networks shown provide circuit stability for output transducers 12 having impedances between 110 and 1000 ohms at 1 KHz, which is an unusually large range. The compensation networks effectively operate to hold the phase angle up above zero, preventing it from falling to zero until the gain has been reduced to less than unity.

In a preferred embodiment of the FIG. 4 circuit, the values of the compensation capacitors were changed to the following: C1A, C1B, 33 pF; C2A, C2B, 27 pF; and C3A C3B, 170 pF. It was found that these values produced minor improvements in the compensation.

It will be noted that the three compensation networks described are a function of the particular fabrication technology used to manufacture the integrated circuits. Variations in this technology would result in different requirements for compensation networks. In addition different types of output tranducers would require different compensation networks.

It will be noted that if diode connected transistor Q7 and its current source Q8 were omitted, the values of the decoupling capacitors CDA and CDB would still be reduced by a factor of 100, but there would be a short turn on delay. However the turn on delay would be substantially reduced, since the value of the decoupling capacitors are 100 times smaller than in the FIG. 1 circuit.

It may also be noted that most practical embodiments of the FIG. 4 circuit will operate from a small battery 14 having an internal impedance which is usually quiter large, typically 10 ohms. When the A side of the FIG. 4 circuit is turned on hard, this will draw (in a worst case condition) approximately a 25 milliampere current peak from the battery, which through the 10 ohm internal resistance causes a 250 millivolt drop or downswing in the battery voltage. The same event occurs when the B side of the circuit is turned on. Therefore the battery voltage plotted against time appears as an inverted full wave rectified signal or ripple, which appears on the battery line 44 and also at points 46A, 46B on the A and B side of the circuit.

The AC signal fed back through the circuit should only by the signal which appears across the load 12, and not the ripple from the battery. The AC feedback signal appears across the base-emitter junction of transistor Q6A. Since the battery voltage ripple appears on the emitter of transistor Q6A but is also applied to the base of transistor Q6A through transistor Q5A, the two cancel, thereby eliminating the effect of the battery ripple.

It will finally be noted that by employing transistor Q5A as a level shifter, both the AC and DC feedback loops can be brought to the same point, namely the base of transistor Q6A and then to summing junction S. Transistor Q6A, being of opposite type to transistor Q1A, is then able to deliver both the AC and DC feedback signals to the summing junction S. Transistor Q6 is able to perform this function even though the AC feedback is referenced to the positive power supply to the circuit, whereas the DC feedback is derived with respect to ground.

I claim:

1. A class B push-pull integrated circuit amplifier suitable for operation with a low voltage power supply and for amplifying an input signal comprising a first AC input signal and a second AC input signal identical to said first signal but 180 degrees out of phase with respect thereto, said amplifier comprising:
   (a) two half circuits, each half circuit being the same as the other and each comprising:
      (i) first and second opposite conductivity type transistors each having an emitter, a base and a collector and having their collectors connected together at a summing node,
      (ii) a third transistor connected to said summing node for amplification of a signal received by said third transistor from said summing node,
      (iii) a fourth transistor connected to said third transistor for amplifying a signal received from said third transistor and having an output for producing an output signal,
      (iv) a DC feedback loop for controlling the idle current of said fourth transistor, said DC feedback loop comprising a fifth transistor connected to said fourth transistor, and means connecting said fifth transistor to the base of said second transistor,
      (v) an AC feedback loop for controlling the AC gain from said first transistor to said fourth transistor and comprising voltage level shifting means connected between said output of said fourth transistor and said base of said second transistor,
      (vi) and a decoupling capacitor connected to said fifth transistor,
   (b) the emitters of said first transistors and said decoupling capacitors being adapted to be connected to one pole of said power supply,
   (c) the emitters of said second transistors being adapted to be connected to the other pole of said power supply,
   (d) the base of said first transistor of one said half circuit being adapted to receive said first AC input signal and the base of said first transistor of the other said amplifier half being adapted to receive said second AC inut signal, (e) said outputs of said fourth transistors being adapted to be connected to a load.

2. An amplifier according to claim 1 including diode means having first and second terminals, said decoupling capacitors being connected together and to one terminal of said diode means at a second node, the other terminal of said diode means being adapted to be connected to said one pole of said power supply, so that said decoupling capacitors may be connected to said one pole of said power supply through said diode means, and current generating means for generating a current through said diode means to produce a voltage drop thereacross for reducing charging of said decoupling capacitors in operation of said amplifier.

3. An amplifier according to claim 1 including in each half circuit current generating means connected to said third transistor for producing a controlled idle current through said third transistor.

4. A circuit according to claim 1 wherein in each half circuit said level shifting means comprises a sixth transistor of the same conductivity type as said second transistor.

5. A circuit according to claim 4 including compensation means in each half circuit for controlling the gain and phase shift of said first and second AC input signals in said amplifier to limit instability of said amplifier, said compensation means comprising a first compensation network coupled between said third and fourth transistors, a second compensation network coupled between said fourth and sixth transistors, and a third compensation network coupled between said second and sixth transistors.

6. An amplifier according to claim 1 wherein said first, fourth and fifth transistors are of one conductivity type and said second and third transistors are of the opposite conductivity type.

7. A class B push-pull integrated circuit amplifier suitable for operation with a low voltage power supply and comprising:
(a) generating means for accepting an external AC input signal and for generating therefrom a first AC input signal proportional to said external signal and a second AC input signal identical to said first AC inut signal but 180 degrees out of phase with respect thereto,
(b) means for generating a DC bias signal,
(c) two half circuits, each half circuit being the same as the other and each comprising:
  (i) first, second, third, fourth and fifth transistors, each having an emitter, base collector,
  (ii) said first and second transistors being of opposite conductivity type and having their collectors connected together at a summing node,
  (iii) a third transistor having its base connected to said summing node for amplification of a signal received by said third transistor from said summing node,
  (iv) a fourth transistor having its base connected to the collector of said third transistor for amplifying a signal received from said third transistor and for producing an output signal at the collector of said fourth transistor,
  (v) a DC feedback loop for controlling the idle current of said fourth transistor and comprising a fifth transistor having its base connected to the base of said fourth transistor, and means connecting the collector of said fifth transistor to the base of said second transistor,
  (vi) an AC feedback loop for controlling the AC gain from said first transistor to said fourth transistor and comprising voltage level shifting means connected between the collector of said fourth transistor and the base of said second transistor,
  (vii) and a decoupling capacitor connected to the base of said fifth transistor,
(d) the emitters of said first transistors and said decoupling capacitors being adapted to be connected to one pole of said power supply,
(e) the emitters of said second transistors being adapted to be connected to the other pole of said power supply,
(f) means connecting said generating means to the base of said first transistor of one half circuit for applying said first AC input signal and said DC bias signal to said first transistor thereof, and means connecting said generating means to the base of said first transistor of the other half circuit for applying said second AC signal and said DC bias signal to said first transistor of said other half circuit,
(f) the outputs of said fourth transistors being adapted to be connected to a load.

8. An amplifier according to claim 7 and including diode means having first and second terminals, said decoupling capacitors being connected together and to one terminal of said diode means at a second node, the other terminal of said diode means being adapted to be connected to said one pole of said power supply, so that said decoupling capacitors may be connected to said one pole of said power supply through said diode means, and current generating means for generating a current through said diode means to produce a voltage crop thereacross for reducing charging of said decoupling capacitors in operation of said amplifier.

9. An amplifier according to claim 8 and including in each half circuit current generating means connected to the collector of each third transistor for producing a controlled idle current through each third transistor.

10. An amplifier according to claim 9 wherein in each half circuit said AC feedback loop comprises a resistive voltage divider connected to the collector of said fourth transistor, said level shifting means comprising a sixth transistor connected between said voltage divider and the base of said second transistor.

11. An amplifier according to claim 10 wherein said first, fourth and fifth transistors are of one conductivity type and said second, third and sixth transistors are of the opposite conductivity type.

12. An amplifier according to claim 11 wherein said one conductivity type is NPN and said opposite conductivity type is PNP.

13. An amplifier according to claim 7 and including in each half circuit current source means connected to the collector of said third transistor for supplying and setting the collector current thereof.

* * * * *